(12) United States Patent
Hwang

(10) Patent No.: US 7,660,105 B2
(45) Date of Patent: Feb. 9, 2010

(54) PLASMA DISPLAY DEVICE

(75) Inventor: Tae-Sin Hwang, Chunan-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 311 days.

(21) Appl. No.: 11/489,416

(22) Filed: Jul. 18, 2006

(65) Prior Publication Data

US 2007/0018577 A1   Jan. 25, 2007

(30) Foreign Application Priority Data

Jul. 21, 2005   (KR) .................. 10-2005-0066251

(51) Int. Cl.
*G06F 1/16* (2006.01)
(52) U.S. Cl. .............. 361/679.27; 345/206; 313/582; 248/309.1
(58) Field of Classification Search ............. 361/681, 361/679.01, 679.02, 679.05, 679.22, 679.27; 313/582, 46, 112; 345/37, 60, 206; 248/27.1, 248/309.1
See application file for complete search history.

(56) References Cited

U.S. PATENT DOCUMENTS

| | | | |
|---|---|---|---|
| 6,359,390 B1 | 3/2002 | Nagai | |
| 6,532,152 B1* | 3/2003 | White et al. | 361/692 |
| 6,703,702 B2* | 3/2004 | Inoue et al. | 257/684 |
| 6,744,186 B2* | 6/2004 | Oishi et al. | 313/46 |
| 6,862,053 B2* | 3/2005 | Lee et al. | 349/58 |
| 6,909,475 B2* | 6/2005 | Kojima et al. | 349/58 |
| 6,972,963 B1* | 12/2005 | Chou | 361/760 |
| 7,006,168 B2* | 2/2006 | Lee | 349/58 |
| 7,006,170 B2* | 2/2006 | Inoue | 349/60 |
| 7,059,473 B2* | 6/2006 | Watanabe et al. | 206/454 |
| 7,372,704 B2* | 5/2008 | Jeong | 361/719 |
| 2003/0090458 A1* | 5/2003 | Tajima | 345/156 |
| 2005/0067963 A1* | 3/2005 | Kim et al. | 313/583 |
| 2005/0093429 A1* | 5/2005 | Ahn et al. | 313/498 |
| 2005/0174301 A1* | 8/2005 | Kim | 345/3.1 |
| 2008/0232052 A1* | 9/2008 | Kim et al. | 361/681 |

FOREIGN PATENT DOCUMENTS

| | | |
|---|---|---|
| EP | 1 195 791 A2 | 4/2002 |
| JP | 03-160488 A | 7/1991 |
| JP | 2000-181370 A | 6/2000 |

(Continued)

OTHER PUBLICATIONS

The Extended European Search Report by European Patent Office on Jan. 26, 2007.

*Primary Examiner*—Hung V Duong
(74) *Attorney, Agent, or Firm*—Knobbe Martens Olson & Bear LLP

(57) ABSTRACT

A plasma display device is disclosed. In an embodiment, the plasma display device includes a plasma display panel, a circuit board assembly, a chassis base, a signal transmission member, a cover plate, and a reinforcing member. The reinforcing member is assembled to an edge of the chassis base. The reinforcing member includes a main body and a protruding portion protruded therefrom. The protruding portion is protruded toward an internal surface of the cover plate. It secures a space, for the signal transmission member, between the main body and the cover plate.

21 Claims, 5 Drawing Sheets

FOREIGN PATENT DOCUMENTS

| | | |
|---|---|---|
| JP | 2002-123186 A | 4/2002 |
| JP | 2003-216057 A | 7/2003 |
| JP | 2003-255852 A | 9/2003 |
| JP | 2004-258291 A | 9/2004 |
| JP | 2005-128533 A | 5/2005 |
| KR | 10-2005-0022540 A | 3/2005 |
| KR | 10-2006-0031903 A | 4/2006 |

* cited by examiner

PLASMA DISPLAY DEVICE

CROSS-REFERENCE TO RELATED APPLICATION

This application claims priority to Korean patent application No. 10-2005-0066251 filed in the Korean Intellectual Property Office on Jul. 21, 2005 of the earlier filing date, the content of which is herein incorporated by reference in their entirety.

BACKGROUND OF THE INVENTION

1. Field of the Invention

The present invention relates to a plasma display device.

2. Description of the Related Technology

Generally, a plasma display device is a display tool that uses plasma generated by gas discharge to display images on a plasma display panel (PDP).

The plasma display device generally includes the PDP, a chassis base, a circuit board assembly, a cover plate, and a casing. The PDP displays an image, and the chassis base supports the PDP. The circuit board assembly is mounted on the chassis base and is electrically connected to the display electrodes and the address electrodes of the PDP through flexible printed circuits, connectors, and so on. The casing surrounds the PDP, the chassis base, the circuit board assembly, and the cover plate while constituting an outer frame of the plasma display device.

Generally, the PDP is manufactured by arranging surfaces of two glass substrates to face each other and seal a space therebetween. A plurality of discharge cells are formed therebetween. In the PDP, images are displayed by exciting phosphors. The phosphors are excited by vacuum ultraviolet radiation which is generated by a gas discharge in the discharge cells. It is possible for the PDP to realize a large, thin, and lightweight display having good qualities of display capacity, brightness, contrast, visual angle, and so on.

The chassis base, which is attached to the PDP, is made of a metal having strong mechanical strength in order to support the PDP. The chassis base plays a role in maintaining strength of the plasma display device. It also mounts and supports the circuit board assembly. Furthermore, it acts as a heat sink of the PDP and as a ground for reducing electromagnetic interference (EMI).

The circuit board assembly is electrically connected to the PDP so as to supply driving signals to the PDP. A plurality of driving integrated circuit (IC) packages are connected to the circuit board assembly and the PDP so that driving signals can be transferred from the circuit board assembly to the electrodes of the PDP.

The cover plate covers the driver IC packages and is fixed on the chassis base via screws. Therefore, the driver IC packages are protected by the cover plate.

The casing includes front and rear covers. The front cover is installed in front of the PDP while the rear cover is installed behind the PDP. Here, the front and rear covers generally constitute a structure that can be assembled or disassembled with respect to each other so that it is possible to fix internal elements.

The above discussion in this section is to provide background information about the plasma display devices. No statements in this section constitute an admission of prior art.

SUMMARY OF CERTAIN INVENTIVE ASPECTS

One aspect of the present invention provides a plasma display device with a structure to protect a driver IC package even from an external impact.

Another aspect of the present invention provides a plasma display device including i) a plasma display panel, ii) a circuit board assembly spaced apart from the plasma display panel, iii) a chassis base interposed between the plasma display panel and the circuit board assembly, iv) at least one driver integrated circuit package electrically connected to the plasma display panel and the circuit board assembly, and passing over at least one edge of the chassis base, v) a cover plate covering the driver integrated circuit package, and vi) a reinforcing member assembled to the edge of the chassis base. In one embodiment, the cover plate is supported by the reinforcing member. Furthermore, the chassis base may be spaced apart from the cover plate and a fixed space is formed between the chassis base and the cover plate.

The driver integrated circuit package may pass through the space, the space may be formed between the reinforcing member and the cover plate, and the reinforcing member may include a main body and a plurality of protruding portions protruded from the main body. The protruding portions may support the cover plate, and be spaced apart from each other. The driver integrated circuit package may pass between the protruding portions, pitches between the protruding portions may be substantially the same, and the cover plate may be supported by the protruding portions. A surface of the main body may be slanted near the circuit board assembly, and the space may be formed in the reinforcing member.

A thickness of the reinforcing member may be larger than a thickness of the chassis base, and an inserting groove may be formed on a surface of the reinforcing member such that the edge of the chassis base is inserted into the inserting groove. The reinforcing member may extend along the edge of the chassis base, it may be made of a metal, and it may be attached to the plasma display panel using a double-sided tape.

Another aspect of the present invention provides a plasma display device including i) at least one signal transmission member connected to a plasma display panel and a driving circuit, ii) a cover plate covering at least in part the signal transmission member, and iii) a reinforcing member including a main body and at least one protruding portion extending from the main body. In one embodiment, the at least one protruding portion is configured to maintain a space, for the at least one signal transmission member, between the main body and the cover plate.

Another aspect of the present invention provides a method of using a plasma display device including i) providing at least one signal transmission member connected to a plasma display panel and a driving circuit, ii) providing a cover plate covering at least in part the signal transmission member, iii) providing a reinforcing member including a main body and at least one protruding portion extending from the main body, and iv) preventing, by the use of the at least one protruding portion, the at least one signal transmission member from contacting either of the main body and the cover plate when an external impact is applied to the cover plate.

Another aspect of the invention provides a plasma display device, comprising: at least one signal transmission member connected to a plasma display panel and a driving circuit, a cover plate covering at least in part the signal transmission member and a reinforcing member facing the cover plate, wherein at least one hole is defined in the reinforcing member, and wherein the at least one signal transmission member passes through the at least one hole.

BRIEF DESCRIPTION OF THE DRAWINGS

Embodiments of the present invention will be described with reference to the attached drawings.

DETAILED DESCRIPTION OF CERTAIN INVENTIVE EMBODIMENTS

Figure 1:
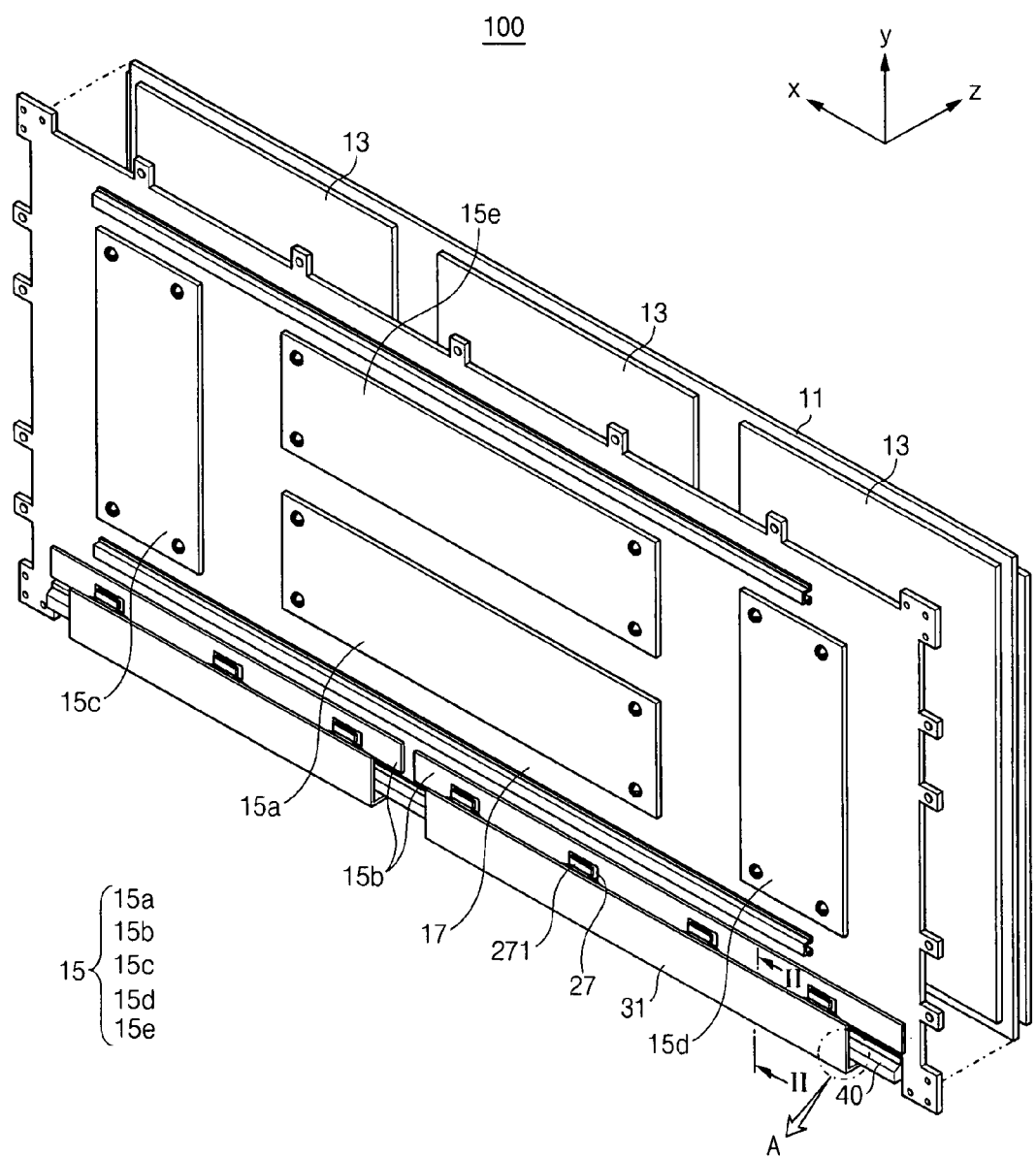
FIG. 1 is a perspective view of a plasma display device according to an embodiment.

Hereinafter, embodiments of the present invention will be described with reference to FIGS. 1 to 6. These embodiments are merely to illustrate various features and aspects of the present invention, and the present invention is not limited to the illustrated embodiments. In the embodiments, like reference numerals refer to like elements.

As illustrated in FIG. 1, a plasma display device 100 includes a PDP 11, a circuit board assembly 15, a chassis base 17, a driver IC package 27, a cover plate 31, and a reinforcing member 40. The plasma display device shown in FIG. 1 is merely to illustrate an embodiment of the present invention, and the present invention is not limited thereto.

Since a detailed internal structure of the PDP 11 can be easily understood by the ordinary person in the art, a detailed explanation thereof is omitted for convenience. A PDP having various structures can be adapted to the plasma display device 100.

The circuit board assembly 15 is electrically connected to the PDP 11 for transferring driving signals thereto. The circuit board assembly 15 includes a display processing/controlling board 15a, an address driving board 15b, a scanning driving board 15c, a sustain driving board 15d, and an electric source board 15e. Since detailed functions of the aforementioned boards can be easily understood by a skilled person, detailed explanation thereof is omitted for convenience.

A plurality of driver IC packages 27 are connected to the PDP 11 and the circuit board assembly 15. A driver IC 271 is mounted on each driver IC package 27. The driver IC packages 27 selectively supply address voltage pulses to address electrodes 21 (see FIG. 2) of the PDP 11 in accordance with control signals of the address driving circuit board assembly 15b.

Figure 2:
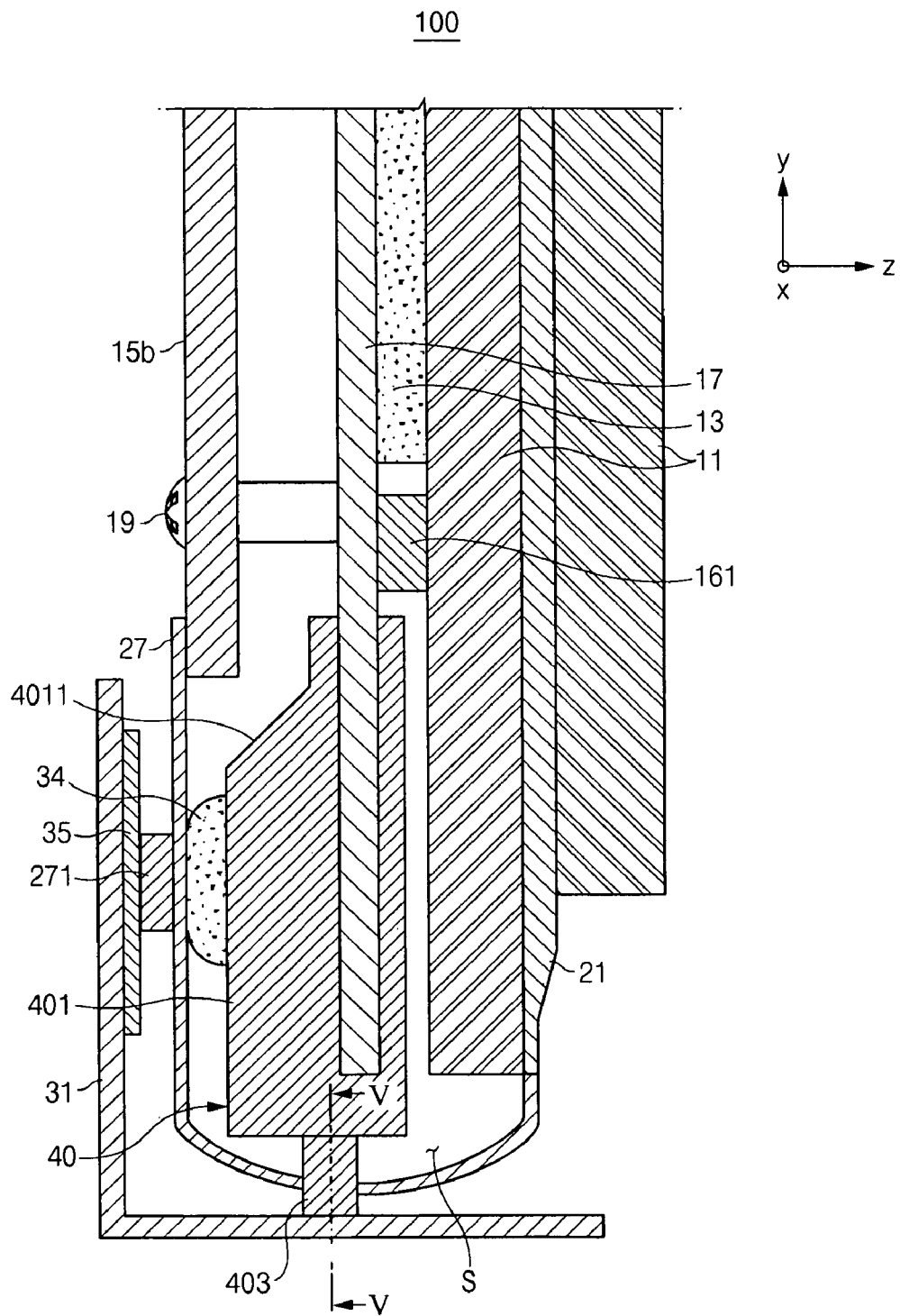
FIG. 2 is a cross-sectional view of the plasma display device taken along a line II-II of FIG. 1.

The PDP 11 may be attached to a front surface of the chassis base 17 via, for example, a double-sided tape 161 (see FIG. 2). In addition, the circuit board assembly 15 may be fixed on a rear surface of the chassis base 17 by using, for example, screws 19 (see FIG. 2), and it is spaced apart from the PDP 11 with the chassis base 17 interposed therebetween. The chassis base 17 can be manufactured by, for example, press-forming a thin metallic material.

The PDP displays images by way of a gas discharge, and the gas discharge generates heat. Since heat can impart a negative thermal effect to elements of the PDP, a heat conductive sheet 13 is interposed between the PDP 11 and the chassis base 17 in order to conductively disperse heat generated from the PDP 11 in a direction parallel to an imaginary xy plane. (see FIG. 1) Multiple heat conductive sheets 13 may be used in order to reinforce the adhesive force between the PDP 11 and the chassis base 17.

As illustrated in FIG. 1, the cover plate 31 covers the driver IC package 27. Since the driver IC package 27 passes over an edge of the chassis base 17 and is then exposed to the outside, the cover plate 31 prevents the package 27 from being damaged due to an external impact. The cover plate 31 may be manufactured by, for example, pressing a thin metallic material. In one embodiment, the cover plate has an "L" shape so as to have sufficient mechanical strength to endure twist and bending.

In one embodiment, the cover plate 31 is configured to entirely cover all of the driver IC packages 27. In this embodiment, it is easy to assemble the cover plate 31. Furthermore, it is possible to prevent a certain driver IC package from being severely damaged from an impact.

The reinforcing member 40 is also provided in the plasma display device 100 in order to protect the driver IC package 27 from an external impact. In an embodiment, the reinforcing member 40 is made of a metal. A structure and effect of the reinforcing member 40 for protecting the driver IC package 27 will be described in detail below with reference to FIG. 2.

As illustrated in FIG. 2, the drive IC package 27 is located in the space formed between the cover plate 31 and the reinforcing member 40. The driver IC 271 generates a significant amount of heat. Therefore, a heat protecting pad 35 may be provided between the cover plate 31 and the driver IC 271. In addition, thermal grease 34 may be provided between the driver IC 271 and the reinforcing member 40. As a result, heat can be efficiently dissipated through the heat protecting pad 35.

Figure 3:
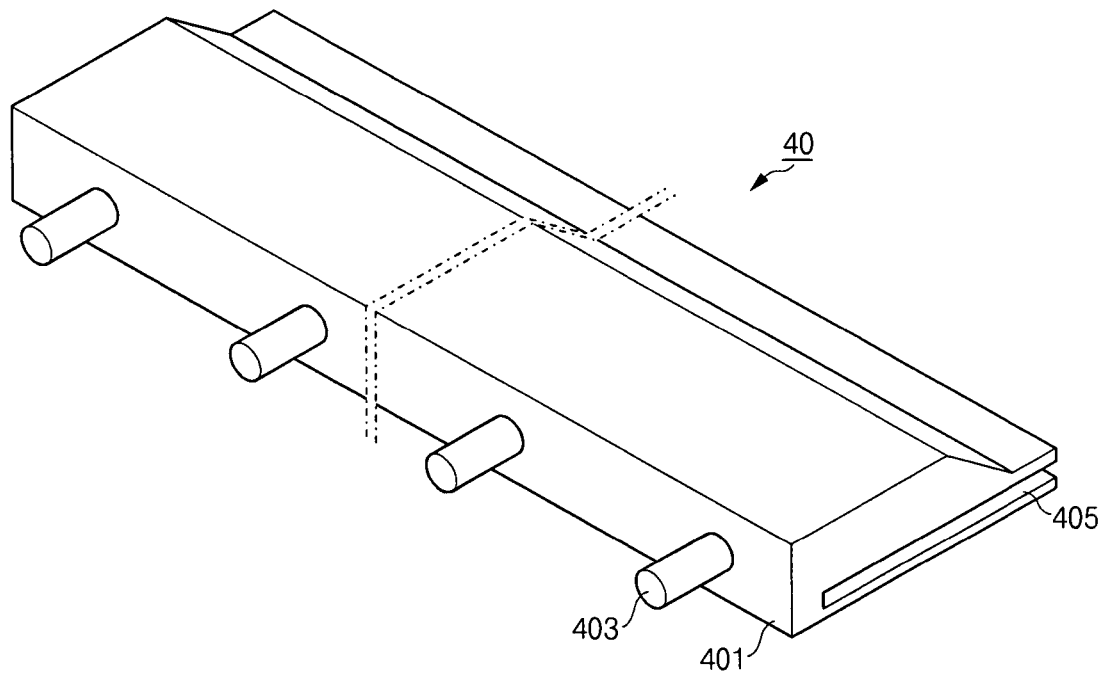
FIG. 3 is a perspective view of a reinforcing member according to an embodiment.

In an embodiment, the reinforcing member 40 includes a main body 401 and a plurality of protruding portions 403 (see FIG. 3). In an embodiment, the protruding portions 403 are protruded from the main body 401 toward the cover plate 31, and the cover plate 31 is supported by the reinforcing member 40. In an embodiment, the protruding portions 403 are integrally formed into the main body 401. In another embodiment, the protruding portions 403 are separately formed and attached to the body 401. The chassis base 17 may be spaced apart from the cover plate 31, and a space S is formed between the chassis base 17 and the cover plate 31. In an embodiment, the cover plate 31 is supported by the protruding portions 403 and a space S is maintained even if an external impact is given to the cover plate 31. In an embodiment, the driver IC package 27 is positioned so as not to collide with either of the reinforcing member 40 and the cover plate 31 although the cover plate 31 is impacted.

Since a conventional plasma display device is not provided with a reinforcing member having a protruding member, the cover plate is deformed by an external impact which causes a driver IC package to hit against at least one of a chassis base and a cover plate, resulting in damaging or breaking the package. Therefore, the plasma display device malfunctions. However, in an embodiment, the driver IC package 27 can be securely protected from an outer impact.

In an embodiment, a surface 4011 of the main body 401 is slanted toward the address driving board 15b such that the address driving board 15b does not contact the surface 4011.

This ensures that a short circuit does not occur between the reinforcing member 40 and the address driving board 15b.

In addition, the thickness of the reinforcing member 40 may be greater than that of the chassis base 17, and may be large enough to protect an edge of the chassis base 17. Therefore, the edge of the chassis base 17 is not deformed even if an external force or impact is given to the chassis base 17. The structure of the reinforcing member 40 will be explained in detail with reference to FIG. 3 below.

As illustrated in FIG. 3, an inserting groove 405 may be formed on a surface of the reinforcing member 40 in a direction substantially parallel to the protruding portions 403. The edge of the chassis base 17 may be firmly inserted into the reinforcing member 40 along the inserting groove 405 so that the reinforcing member 40 can effectively protect the edge of the chassis base 17.

In the conventional art, the chassis base was easily deformed by an external impact, thereby deteriorating the durability of the plasma display device. However, in an embodiment, since the reinforcing member 40 prevents the edge of the chassis base 17 from being deflected, durability of the plasma display device can be enhanced.

Figure 4:
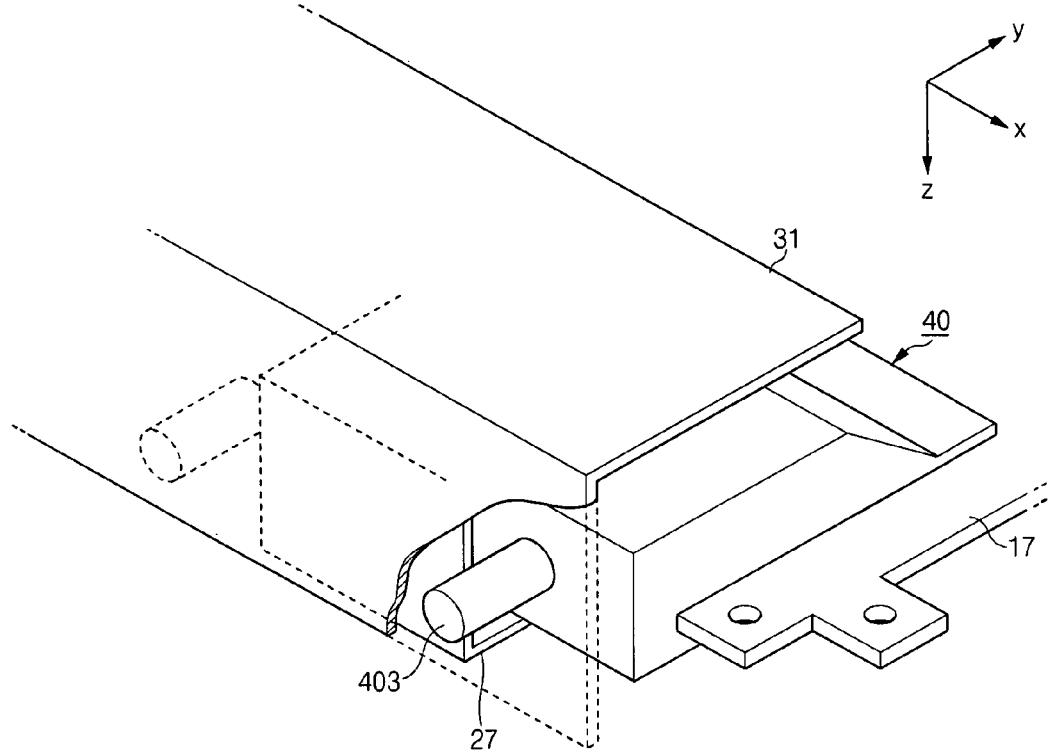
FIG. 4 is an enlarged perspective view of portion A of FIG. 1.

In an embodiment, as illustrated in FIG. 4, the edge of the chassis base 17 is inserted into the inserting groove 405 of the reinforcing member 40, and the reinforcing member 40 extends along the edge of the chassis base 17. In this embodiment, the reinforcing member 40 completely covers the edge of the chassis base 17 and protects it against an external impact. The, cover 31 covers the reinforcing member 40 and the chassis base 17.

In an embodiment, the protruding portions 403 have a cylindrical shape. In this embodiment, even if the driver IC package 27 collides with the protruding portions 403, the impact can be minimized.

Figure 5:
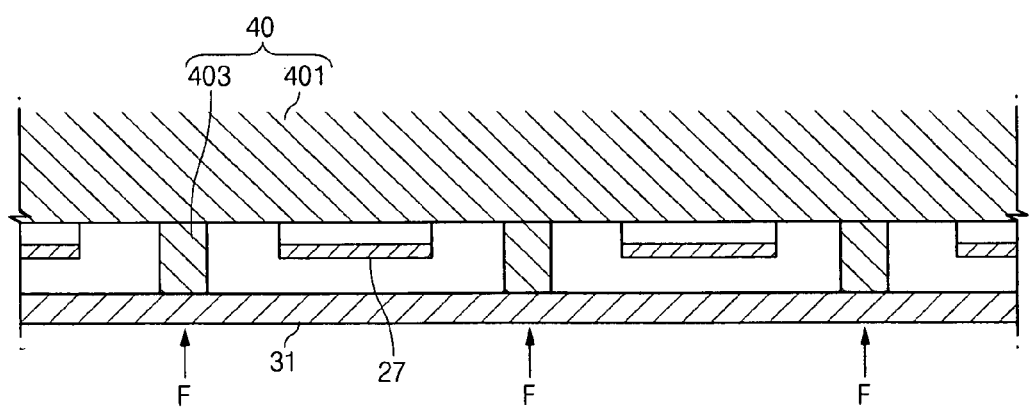
FIG. 5 is a cross-sectional view of the plasma display device taken along a line V-V of FIG. 2.

In an embodiment, as illustrated in FIG. 5, the plurality of protruding portions 403 are spaced apart from each other. Alternatively, although not shown in FIG. 5, openings can be defined in the reinforcing member 40 and the driver IC packages 27 can pass through the openings. In this embodiment, the reinforcing member 40 may not include the protruding portions 403. Each of the driver IC packages 27 is connected to a plurality of the address electrodes that are equally spaced apart from each other, so the driver IC packages 27 are equally spaced apart from each other. In an embodiment, the pitches between the protruding portions 403 should be substantially the same. Therefore, the spaces between the protruding portions 403 can accommodate the driver IC packages 27.

As illustrated in FIG. 5, an external impact F may be applied to the cover plate 31. At this time, the cover plate 31 is supported by the plurality of protruding portions 403 so that the cover plate 31 is not deformed. Therefore, the spaces between protruding portions 403 may be secured to protect the driver IC package 27. Therefore, despite the external impact F, the driver IC packages 27 can still operate well.

In an embodiment, a small gap is formed between the protruding portions 403 and the cover plate 31 so that they do not contact each other. The small gap can be sized about 1.0 mm. In this case, an external impact may cause the cover plate 31 to contact the protruding portion 403. However, since the cover plate 31 can still be supported by the protruding portions 403, the driver IC package 27 is not damaged. Thereafter, the cover plate 31 can restore its original state.

Figure 6:
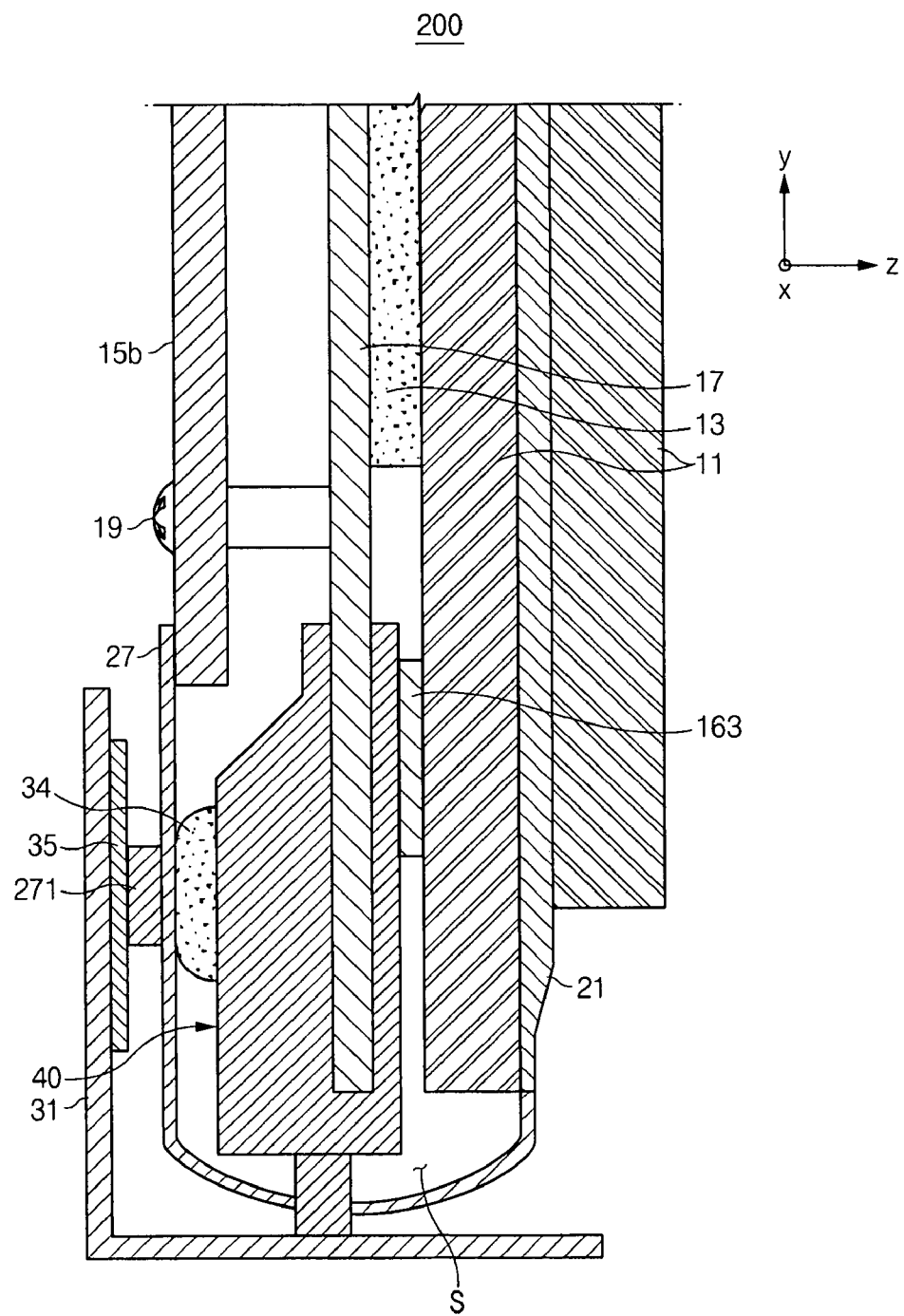
FIG. 6 is a cross-sectional view of the plasma display device according to an embodiment.

FIG. 6 illustrates another cross-sectional view of the plasma display device 200 according to another embodiment. The elements illustrated in FIG. 6 are almost the same as the elements illustrated in FIG. 1.

As illustrated in FIG. 6, the reinforcing member 40 can be attached to the PDP 11 via, for example, a double-sided tape 163. Compared to the FIG. 2 embodiment where the double-sided tape 163 is attached to the chassis base 13, it is much easier in the FIG. 6 embodiment to access the double-sided tape 163 by hand since it is located closer to an edge of the PDP 11. Therefore, the double-sided tape 163 can be easily removed during the maintenance of the plasma display device 200.

While the above description has pointed out novel features of the invention as applied to various embodiments, the skilled person will understand that various omissions, substitutions, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A plasma display device, comprising:
   a plasma display panel;
   a circuit board assembly spaced apart from the plasma display panel;
   a chassis base interposed between the plasma display panel and the circuit board assembly, wherein the chassis base comprises first and second surfaces, wherein the second surface faces away from the first surface, wherein the first surface faces the plasma display panel;
   at least one driver integrated circuit package electrically connected to the plasma display panel and the circuit board assembly, and passing over at least one edge of the chassis base;
   a reinforcing member connected to the edge of the chassis base; and
   a cover plate covering the at least one driver integrated circuit package, wherein the cover plate has a surface facing the reinforcing member,
   wherein the reinforcing member comprises a main body and at least one protruding portion extending from the main body, wherein the main body of the reinforcing member contacts and covers i) part of the first surface of the chassis base and ii) part of the second surface of the chassis base,
   wherein the protruding portion extends toward the surface of the cover plate and maintains a space, for the at least one driver integrated circuit package, between the main body and the cover plate, wherein the plasma display device further comprises an adhesive member formed between the first surface of the chassis base and the plasma display panel so as to define a gap between the chassis base and the plasma display panel, and wherein at least part of the main body is formed in the gap.

2. The device of claim 1, wherein the at least one driver integrated circuit package passes through the space.

3. The device of claim 1, wherein an additional gap is formed between the protruding portion and the surface of the cover plate.

4. The device of claim 3, wherein the additional gap is about 1.0 mm.

5. The device of claim 1, wherein the protruding portion contacts the surface of the cover plate.

6. The device of claim 1, wherein the at least one protruding portion includes a plurality of protruding portions spaced apart from each other.

7. The device of claim 6, wherein the at least one driver integrated circuit package includes a plurality of driver integrated circuit packages each package passing between adjacent protruding portions.

8. The device of claim 6, wherein the protruding portions are substantially equally spaced apart from each other.

9. The device of claim 1, wherein a surface of the main body is slanted near the circuit board assembly.

10. The device of claim 1, wherein a thickness of the reinforcing member is greater than a thickness of the chassis base.

11. The device of claim 1, wherein an inserting groove is formed on a surface of the reinforcing member such that the edge of the chassis base is inserted into the inserting groove.

12. The device of claim 1, wherein the reinforcing member extends along the edge of the chassis base.

13. The device of claim 1, wherein the reinforcing member is made of a metal.

14. The device of claim 1, wherein the reinforcing member is attached to the plasma display panel via a double-sided tape.

15. A plasma display device, comprising:
    a chassis base configured to support a plasma display panel, wherein the chassis base comprises first and second surfaces, wherein the second surface faces away from the first surface, and wherein the first surface faces the plasma display panel;
    at least one signal transmission member connected to a plasma display panel and a driving circuit;
    a cover plate covering at least in part the signal transmission member; and
    a reinforcing member including a main body and at least one protruding portion extending from the main body, wherein the main body of the reinforcing member contacts and covers i) part of the first surface of the chassis base and ii) part of the second surface of the chassis base,
    wherein the at least one protruding portion is configured to maintain a space, for the at least one signal transmission member, between the main body and the cover plate, wherein the plasma display device further comprises an adhesive member formed between the first surface of the chassis base and the plasma display panel so as to define a gap between the chassis base and the plasma display panel, and wherein at least part of the main body is formed in the gap.

16. The plasma display device of claim 15, wherein the at least one signal transmission member does not contact either of the main body and the cover plate when an external impact is applied to the cover plate.

17. The plasma display device of claim 15, wherein the cover plate has a surface facing the reinforcing member, and wherein the protruding portion contacts the surface of the cover plate.

18. The plasma display device of claim 15, wherein the protruding portion has a cylindrical shape.

19. A method of using a plasma display device, comprising:
    providing a chassis base configured to support a plasma display panel, wherein the chassis base comprises first and second surfaces, wherein the second surface faces away from the first surface, and wherein the first surface faces the plasma display panel;
    providing at least one signal transmission member connected to a plasma display panel and a driving circuit;
    providing a cover plate covering at least in part the signal transmission member;
    providing a reinforcing member including a main body and at least one protruding portion extending from the main body, wherein the main body of the reinforcing member contacts and covers i) part of the first surface of the chassis base and ii) part of the second surface of the chassis base, and wherein the protruding portion has a straight-line shape; and
    preventing, by the use of the at least one protruding portion, the at least one signal transmission member from contacting either of the main body and the cover plate when an external impact is applied to the cover plate.

20. A plasma display device, comprising:
    a chassis base configured to support a plasma display panel, wherein the chassis base comprises first and second surfaces, wherein the second surface faces away from the first surface, and wherein the first surface faces the plasma display panel;
    at least one signal transmission member connected to a plasma display panel and a driving circuit;
    a cover plate covering at least in part the signal transmission member; and
    a reinforcing member facing the cover plate, wherein at least one hole is defined in the reinforcing member, wherein the reinforcing member comprises a main body and at least one protruding portion extending from the main body, wherein the protruding portion has a straight-line shape, and wherein the at least one signal transmission member passes through the at least one hole, wherein at least part of the reinforcing member contacts and covers i) part of the first surface of the chassis base and ii) part of the second surface of the chassis base.

21. The device of claim 20, wherein the reinforcing member contacts the cover plate.

* * * * *